United States Patent
Yang et al.

(10) Patent No.: US 8,891,675 B2
(45) Date of Patent: Nov. 18, 2014

(54) POWER-INDEXED LOOK-UP TABLE DESIGN OF DIGITAL PRE-DISTORTION FOR POWER AMPLIFIERS WITH DYNAMIC NONLINEARITIES

(71) Applicant: Texas Instruments Incorporated, Dallas, TX (US)

(72) Inventors: Jie Yang, Saint Paul, MN (US); Zigang Yang, Plano, TX (US); Hardik Prakash Gandhi, Sunnyvale, CA (US); Lars Jorgensen, Royal Oaks, CA (US)

(73) Assignee: Texas Instruments Incorporated, Dallas, TX (US)

( * ) Notice: Subject to any disclaimer, the term of this patent is extended or adjusted under 35 U.S.C. 154(b) by 114 days.

(21) Appl. No.: 13/644,942

(22) Filed: Oct. 4, 2012

(65) Prior Publication Data

US 2013/0083834 A1 Apr. 4, 2013

Related U.S. Application Data

(60) Provisional application No. 61/542,959, filed on Oct. 4, 2011.

(51) Int. Cl.

| | |
|---|---|
| *H04K 1/02* | (2006.01) |
| *H04L 25/03* | (2006.01) |
| *H04L 25/49* | (2006.01) |
| *H03F 3/24* | (2006.01) |
| *H03F 3/189* | (2006.01) |
| *H04B 17/00* | (2006.01) |
| *H04W 52/22* | (2009.01) |
| *H03F 1/32* | (2006.01) |
| *H04B 1/04* | (2006.01) |

(52) U.S. Cl.
CPC .............. *H04B 17/001* (2013.01); *H03F 3/245* (2013.01); *H03F 3/189* (2013.01); *H03F 2200/78* (2013.01); *H04B 2001/0425* (2013.01); *H04L 25/03343* (2013.01); *H04W 52/226* (2013.01); *Y02B 60/50* (2013.01); *H03F 1/3258* (2013.01)
USPC ........................................................ 375/297

(58) Field of Classification Search
CPC ..................................................... H03F 1/3247
USPC ........................................................ 375/297
See application file for complete search history.

(56) References Cited

U.S. PATENT DOCUMENTS

| | | | | |
|---|---|---|---|---|
| 2009/0227216 | A1* | 9/2009 | Lozhkin | 455/114.3 |
| 2009/0252255 | A1* | 10/2009 | Lee et al. | 375/297 |
| 2010/0253426 | A1* | 10/2010 | Su et al. | 330/149 |
| 2010/0321107 | A1* | 12/2010 | Honcharenko | 330/124 R |
| 2011/0163805 | A1* | 7/2011 | Brown et al. | 330/149 |

* cited by examiner

*Primary Examiner* — Tanmay Shah
(74) *Attorney, Agent, or Firm* — Ronald O. Neerings; Frederick J. Telecky, Jr.

(57) ABSTRACT

This invention is a method of power amplifier digital pre-distortion which measures a current power level of the power amplifier, stores in a look up table entries consisting of a power level and a corresponding set of digital pre-distortion coefficients, selects a set of digital pre-distortion coefficients corresponding to the measured power level. If the measured current power level is near a power level index, the digital pre-distortion coefficients correspond to the power level index. If the measured current power level is greater than the maximum power level entry, the digital pre-distortion coefficients is of the maximum power level entry. If the measured current power level is less than the minimum power level entry, the digital pre-distortion is of the minimum power level entry. If the measured current power level is not near a power level index, the digital pre-distortion coefficients are an interpolation.

16 Claims, 6 Drawing Sheets

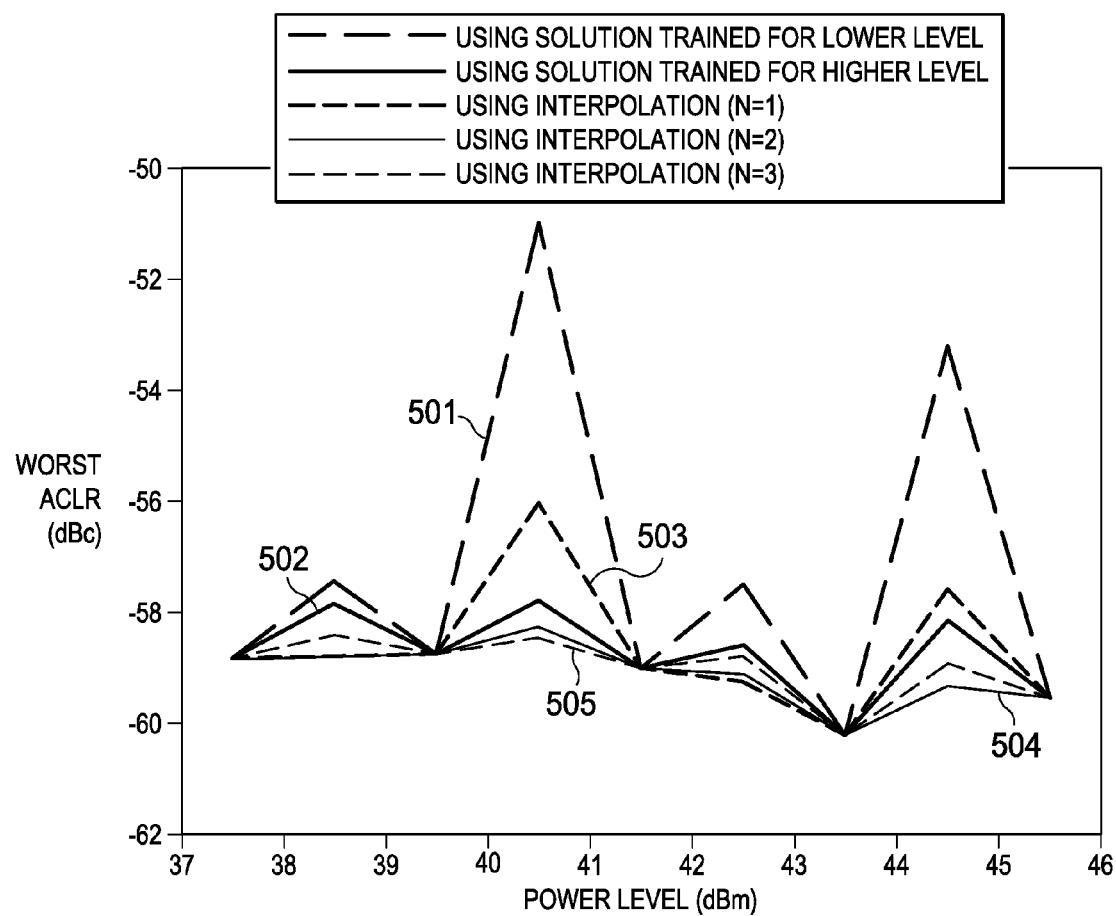

POWER-INDEXED LOOK-UP TABLE DESIGN OF DIGITAL PRE-DISTORTION FOR POWER AMPLIFIERS WITH DYNAMIC NONLINEARITIES

CLAIM OF PRIORITY

This application claims priority under 35 U.S.C. 119(e)(1) to U.S. Provisional Application No. 61/542,959 filed Oct. 4, 2011.

TECHNICAL FIELD OF THE INVENTION

The technical field of this invention is digital pre-distortion in power amplifiers.

BACKGROUND OF THE INVENTION

Power amplifiers (PA) used in radio transmitter for most telecommunication systems have only a limited linear operation region. The nonlinearity introduced by the PA can cause nonlinear distortion of the output signal and interference on adjacent radio channel frequencies. Digital Pre-distortion may compensate for this non-ideal behavior of the PA by pre-distorting the data applying the inverse nonlinearity of PA to the PA input. This thus produces a linear overall system response. Generally PAs exhibit very different nonlinear behavior for signals with different power levels. Applications with multi-carrier communications can have huge power variations over a short time interval. In the LTE signal the carrier power may vary as much as 20 dB over 1 to 2 ms adjacent time slots. It is quite difficult for DPD to re-adapt for a new solution within such short time.

SUMMARY OF THE INVENTION

This invention is a method of power amplifier digital pre-distortion. The method measures a current power level of the power amplifier. The method stores in a look up table entries consisting of a power level and a corresponding set of digital pre-distortion coefficients. The method selects a set of digital pre-distortion coefficients corresponding to the measured power level. If the measured current power level is near a power level index in the look up table, the digital pre-distortion coefficients correspond to the power level index. If the measured current power level is greater than the maximum power level entry in the look up table, the digital pre-distortion coefficients corresponding to the maximum power level entry in the look up table. If the measured current power level is less than the minimum power level entry in the look up table, the digital pre-distortion coefficients corresponding to the minimum power level entry in the look up table. If the measured current power level is not near a power level index in the look up table, the digital pre-distortion coefficients are an interpolation digital pre-distortion coefficients for the nearest power level indices.

A digital pre-distortion unit generates digital pre-distortion corresponding to the digital pre-distortion coefficients. This is applied to the power amplifier typically via a digital to analog converter.

The method determining a power level change between the measured power level and a prior power level. The method selects a next power level in the look up table if the determined power level change is beyond a preset range.

The interpolation includes $$w_{current} = w_{high} * f(\alpha) + w_{low} * (1 - f(\alpha))$$

$$f(\alpha) = 1 - (1 - \alpha)^n$$

$$n = 1, 2, \ldots 5$$

$$\alpha = \frac{10\log_{10}(P_{current}/P_{low})}{10\log_{10}(P_{high}/P_{low})}$$

$$P_{current} \in (P_{low}, P_{high})$$

where: $w_{current}$ is a DPD coefficient to be calculated corresponding to DPD coefficients $w_{high}$ of $P_{high}$ and $w_l$ of $P_{low}$; $P_{current}$ is the current measured power level; $P_{high}$ is the index power level in the look up table next higher than $P_{current}$; $P_{low}$ is the index power level in the look up table next lower than $P_{current}$; and $P_{current}$, $P_{low}$, $P_{high}$ and $\alpha$ are in the dB domain.

The entries in the look up table are updated according to measured power level and distortion during use. The measured distortion permits calculation of corresponding digital pre-distortion coefficients for compensation. In a first embodiment the power level indices are fixed and only the digital pre-distortion coefficients are updated. In a second embodiment both parts on an entry may be updated.

Updating in the second embodiment includes replacing only the digital pre-distortion coefficients if the measured power is near a power level index. A new entry is created if the look up table is not full. Otherwise a current entry in the look up table which is the lower power level of the smallest determined gap with is replaced with a new entry having a power level entry corresponding to the measured power level and the calculated digital pre-distortion coefficients.

Higher power level density for higher power levels is achieved by segmenting the look up table into at least two power level portions and updating only entries of the look up table with the portion of the segmented look up table having a power range including the measured power.

Each entry may have an expiration time when the distortion over time of the power amplifier is unstable. An entry in the look up table is deleted upon elapse of the corresponding expiration time.

BRIEF DESCRIPTION OF THE DRAWINGS

These and other aspects of this invention are illustrated in the drawings, in which:

FIG. 5 are plots of worst case ACLR in decibells (dBc) at various power levels (dBm) for different interpolation methods;

DETAILED DESCRIPTION OF PREFERRED EMBODIMENTS

This invention is a power-indexed look up table (LUT) design for DPD. This invention offers a DPD solution for the current power level by storing, switching, and interpolating multiple DPD solutions in hardware. The power-indexed LUT stores multiple solutions. The LUT stores the DPD coefficients (DPD1, DPD2, ... DPDn) and the corresponding power index (P1, P2, ... Pn) for each solution.

Figure 1:
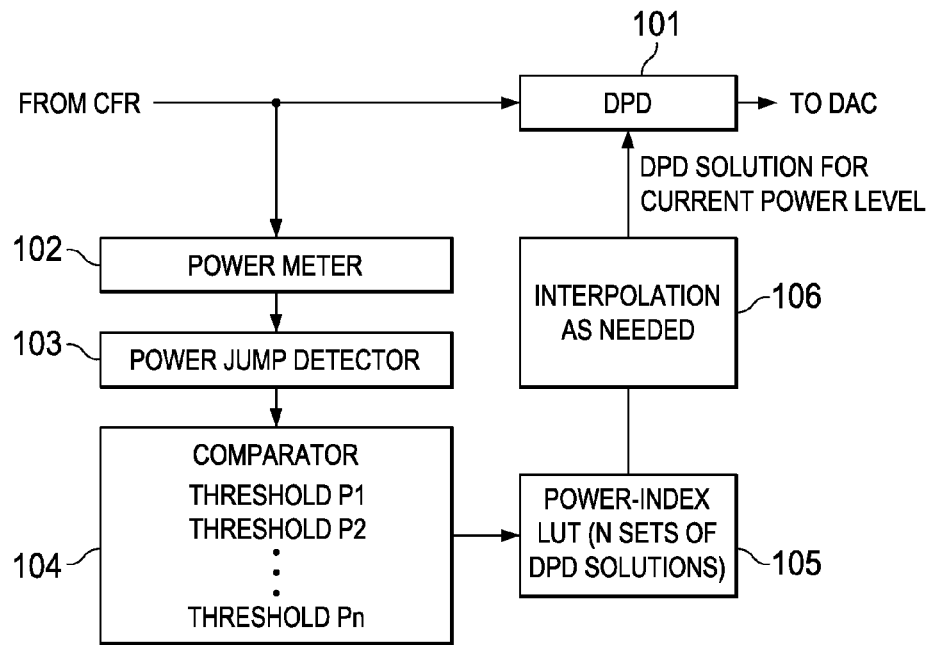
FIG. 1 is a system block diagram of a power-indexed look up table (LUT) pre-distortion of this invention.

FIG. 1 is a system block diagram of the power-indexed LUT design for DPD of this invention. An input to the PA supplies both DPD unit 101 and power meter 102. Power meter 102 forms a running average power meter of the power level change of the input signal. Power jump detector 103 detects any sharp change in the power level. This power level data is supplied to comparator 104. Comparator 104 compares the current power level with a set of power thresholds P1, P2, ... Pn. The result of the comparison is an index into power index look up table 105. Power jump detector 103 determines if a detected power change is beyond a preset range. If this is the case, then comparator 104 selects a shifted power index thus selecting a different DPD solution. Interpolator 106 interpolates between an indexed DPD solution and an adjacent DPD solution if needed. The selected DPD solution is supplied to DPD unit 101. According to the known art DPD 101 generates the digital distortion via a non-linear polynomial model. LUT 105 stores a set of coefficients for this model at each indexed power level. In the preferred embodiment LUT 105 includes 16 entries. These coefficients recalled from LUT 105 or interpolated coefficients produced by interpolator 106 are supplied to DPD unit 101. This set of coefficients is called a DPD solution. DPD unit 101 supplies the thus determined pre-distortion to a digital to analog converter and hence to the power amplifier.

The DPD solution can be one of a set of coefficients previously stored in power-indexed LUT 105 or it can be an interpolated coefficients formed by interpolator 106 when the current power level lies between two power indexes. Different interpolation methods can be used. This invention includes a set of nonlinear and linear interpolation methods.

The power-indexed LUT design is separated into two parts: LOAD and UPDATE. The LOAD procedure switches to a new solution during power hopping. The UPDATE procedure fills and updates the power-indexed LUT. Note that the LUT size, the interpolation methods, LOAD and UPDATE strategy can be flexibly set by different parameters to accommodate different types of PAs or different types of signals.

LOAD Procedure

Figure 2:
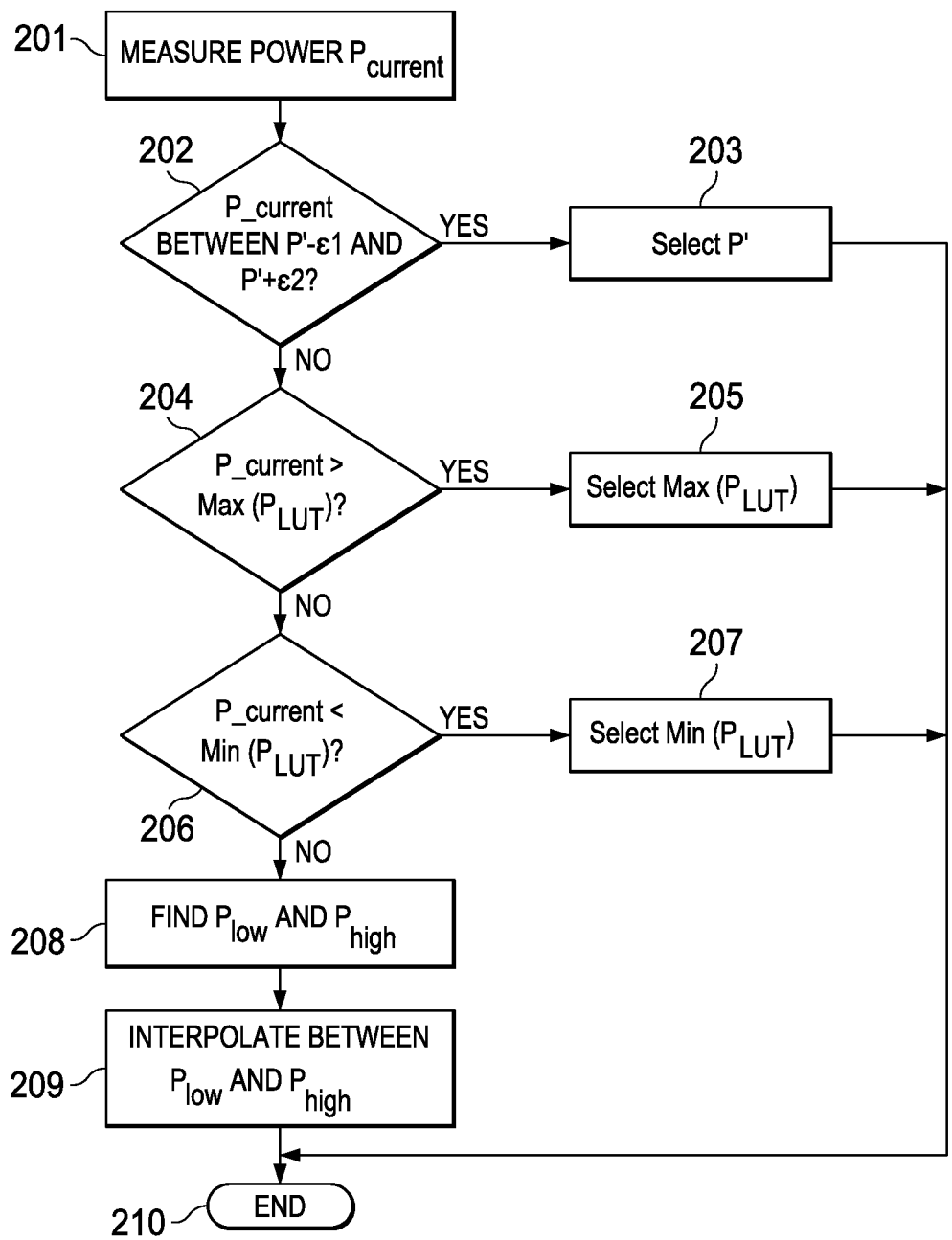
FIG. 2 is a flow chart of the LOAD procedure of this invention.

FIG. 2 is a flow chart of the LOAD procedure. The LOAD procedure begins by measuring $P_{current}$ (block 201) as described above in conjunction with power meter 102. Text block 202 determines whether $P_{current}$ is between $P'-\epsilon 1$ and $P'+\epsilon 2$, where: P' is the nearest power table index to $P_{current}$; and $\epsilon 1$ and $\epsilon 2$ are small empirical constants.

If $P_{current}$ falls between [$P'-\epsilon 1$, $P'+\epsilon 2$] (Yes at test block 202), then block 203 selects P' as the power index into LUT 105. The DPD solution corresponds to the data stored in LUT 105 at power index P'.

If $P_{current}$ does not falls in [$P'-\epsilon 1$, $P'+\epsilon 2$] (No at test block 202), then test block 203 determines if $P_{current}$>Max($P_{LUT}$) where: Max($P_{LUT}$) is the maximum power level index into LUT 105. If $P_{current}$>Max($P_{LUT}$) (Yes at test block 204), then block 205 selects Max($P_{LUT}$) as the power index into LUT 105. The DPD solution corresponds to the data stored in LUT 105 at power index Max ($P_{LUT}$).

If $P_{current}$ is not greater than Max($P_{LUT}$) (No at test block 204), then test block 206 determines if $P_{current}$<Min($P_{LUT}$). If $P_{current}$<Min($P_{LUT}$) (Yes at test block 206), then block 207 selects Min($P_{LUT}$) as the power index into LUT 105. The DPD solution corresponds to the data stored in LUT 105 at power index Min($P_{LUT}$).

If $P_{current}$ is not less than Min($P_{LUT}$) (No at test block 206), then $P_{current}$ lies between power indices into LUT 105. Block 208 determines the power index $P_{low}$ next lower than $P_{current}$ and the power index $P_{high}$ next higher than $P_{current}$. Block 209 forms an interpolation DPD solution between the DPD solutions corresponding to $P_{low}$ and $P_{high}$. The interpolation function can be adjustable for low/high power region and when power level falls in different region between two stored power levels.

Upon selection of the power index and the corresponding DPD solution the LOAD procedure exits at end block 210.

Interpolation Method

When current power level $P_{current}$ lies between in LUT entries ($P_{low}$<$P_{current}$<$P_{high}$) LUT 105 stores DPD solutions including $w_{low}$ for $P_{low}$ and $w_{high}$ for $P_{high}$. We can use interpolation of the two ($w_{low}$, $w_{high}$) as the DPD solution ($w_{current}$) for current signal.

There are many ways to do the interpolation. One embodiment of this invention uses this interpolation method.

$$w_{current} = w_{high} * f(\alpha) + w_{low} * (1 - f(\alpha))$$

$$f(\alpha) = 1 - (1 - \alpha)^n$$

$$n = 1, 2, \ldots 5$$

$$\alpha = \frac{10\log_{10}(P_{current} / P_{low})}{10\log_{10}(P_{high} / P_{low})}$$

$$P_{current} \in (P_{low}, P_{high})$$

where: $w_{current}$ is a DPD coefficient to be calculated corresponding to DPD coefficients $w_{high}$ and $w_{low}$; $P_{current}$ is the current measured power level; $P_{high}$ is the index power level in the look up table next higher than $P_{current}$; $P_{low}$ is the index power level in the look up table next lower than $P_{current}$; and $P_{current}$, $P_{low}$, $P_{high}$ and $\alpha$ are in the dB domain. When n=1, this method is linear interpolation. When n>1, this method is nonlinear interpolation. Nonlinear interpolation with more dependency on DPD solution for $P_{high}$ produces better results compared with linear interpolation. The coefficient n can be adjusted to control the degree of dependency on DPD solution for $P_{high}$ for different power region of the PA or different types of PAs.

UPDATE Procedure

This invention proposes to update the Power-indexed LUT. Update methods measure distortion during use on real input signals and change the data and/or power level indices in the LUT accordingly. There are many ways to update the LUT.

A first update method uses fixed power indexes and updates the DPD solution for these determined power indexes. When the current power level equals or is close to one of these predetermined power indices, then the DPD solution is updates to compensate for the current measured distortion. When the current power level is not equal to or close to one of these predetermined power indexes, the DPD solution of one adjacent power index is updated using interpolation. This is believed to disadvantageously compromise performance.

A second update method updates both the power indexes and the DPD solution. Thus neither the power indexes nor the density of the power indexes is pre-set in the LUT. The update is based on traffic signals to ensure the accuracy of the LUT.

Figure 3:
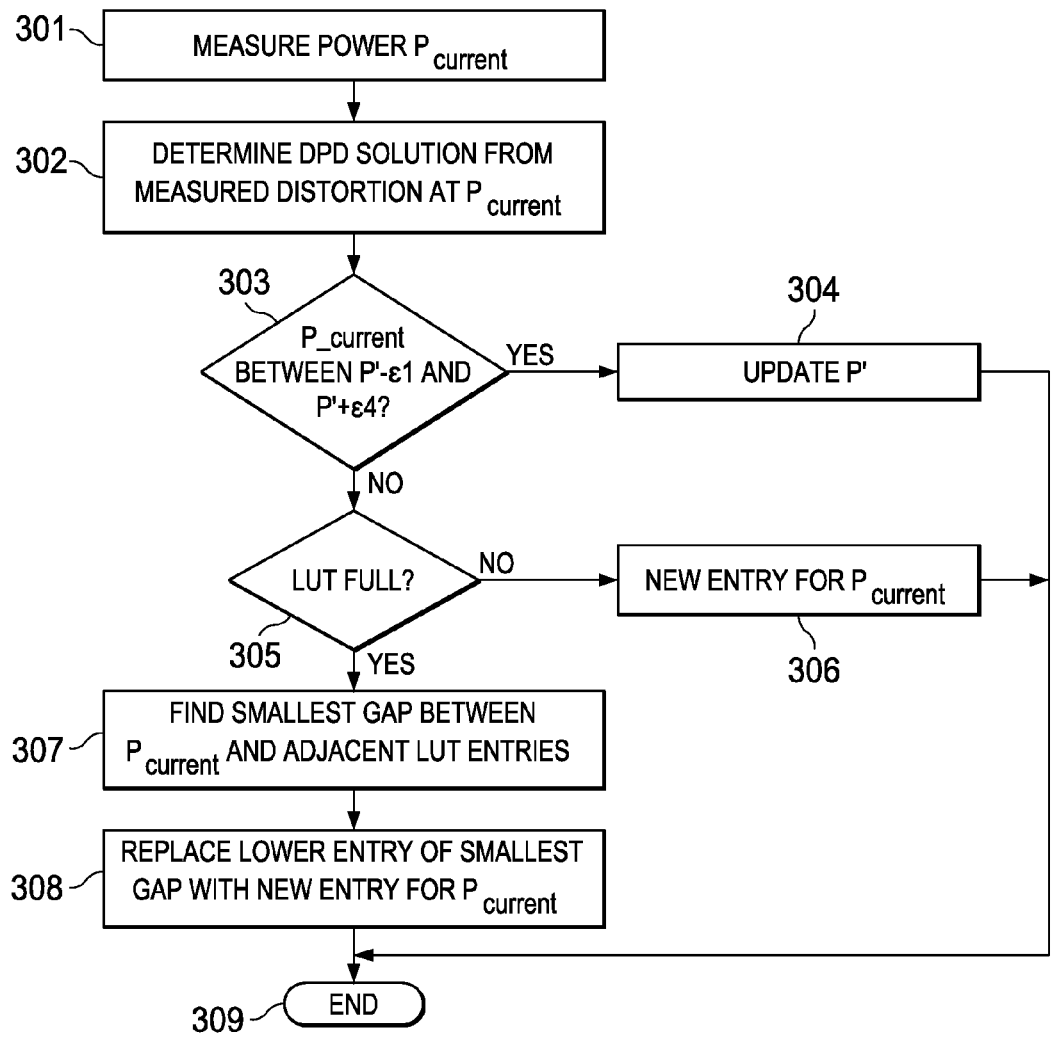
FIG. 3 is a flow chart of the UPDATE procedure of this invention.

FIG. 3 is a flow chart of an exemplary UPDATE procedure of this invention that can update both power level indexes and DPD solutions. This UPDATE procedure needs $P_{current}$ (block 301) and the DPD solution corresponding to the measured distortion at $P_{current}$ (block 302).

Test block 303 determines if $P_{current}$ is between $P'-\epsilon 3$ and $P'+\epsilon 4$, where: $P'$ is the nearest power table index to $P_{current}$; and $\epsilon 3$ and $\epsilon 4$ are small empirical constants used similarly to $\epsilon 1$ and $\epsilon 2$. If $P_{current}$ between $P'-\epsilon 3$ and $P'+\epsilon 4$ (Yes at test block 303), then block 304 updates $P'$ by overwriting the DPD solution for $P_{current}$ over the previous DPD solution for $P'$.

If $P_{current}$ is not between $P'-\epsilon 3$ and $P'+\epsilon 4$ (No at test block 303), then test block 305 determines if the LUT is full. If the LUT is not full (No at test block 305), then block 306 stores a new entry with $P_{current}$ as the index and the corresponding calculated DPD solution.

If the LUT is full (Yes at test block 305), then block 306 sorts the gaps between $P_{current}$ and the adjacent power level indexes in the LUT. Block 306 finds the two power indices with the smallest gap. Block 307 replaces the LUT entry for the lowest prior power index of this smallest gap. Upon selection of the update to the LUT either at block 304, 306 or 309, the UPDATE procedure exits at end block 309.

There are several additional options to this UPDATE procedure. Generally higher power operation of the PA has greater variation with power level than lower power operation. Best operation thus requires more dense DPD solutions at higher power levels. This can be achieved by segmenting the LUT by power region. Separate portions of the LUT are devoted to corresponding power ranges. Greater density at higher power is provided by allocating a larger LUT size for high power operation region compared with low power operation region. Each separate power region is updated at noted above but current data cannot replace LUT entries in a differing power range.

There may be occasions when the PA is not very stable in time. This can be handled by setting an expiration time to each loaded DPD solution. Upon expiration of that time this LUT entry is deleted. This ensures that the LUT holds only current data which is best suited for an unstable situation.

Adaptive Gain

This invention proposes a fast gain compensation before the DPD to handle dynamic cases. Such dynamic cases can occur when the DPD solution is trained based on the PA output with a certain dynamic input pattern and used to a different PA input pattern. This causes DPD performance degradation.

Figure 4:
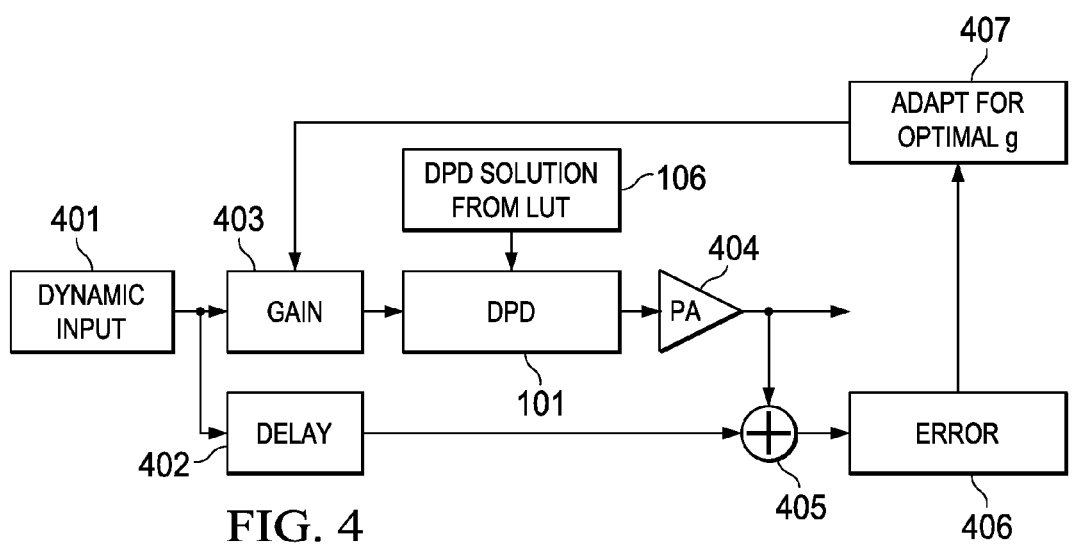
FIG. 4 is a system block diagram of a gain adjustment for a digital pre-distortion (DPD)

FIG. 4 illustrates a system block diagram of a fast gain compensation. Block 401 is the dynamic input. This supplies a delay 402 and an adjustable gain block 403. The output of adjustable gain block 403 supplies the input to DPD unit 101. DPD unit 101 also receives the DPD solution from interpolator 106. DPD unit 101 supplies an input to PA 404 (preferably via a digital to analog converter which is not shown). PA drivers two outputs. The first is the normal amplifier output. The second is one input of adder 405. The other input of adder 405 is the output of delay 402. The sum of adder 405 is an error in block 406. This error is fed to block 407 which generates an adaptive gain corresponding to the error signal. This adaptive gain is supplied to adjustable gain block 403 to control its gain.

Power jump detector 102 detects power jumping. Upon such detection comparator 104 switches to a new DPD solution.

Power jump detector 102 determines power hopping has occurred if a change in power level is beyond a preset range.

In the LOAD procedure the inventors expect that a high loading frequency from LUT of about once every 100 μs produces better performance for signals that contain a short burst.

FIG. 5 illustrates performance of this invention at several power levels (37.5 dBm, 39.5 dBm, 41.5 dBm, 43.5 dBm and 45.5 dBm) for various interpolations. Curve 501 illustrates the response for DPD solutions trained for lower power levels. Curve 502 illustrates the response for DPD solutions trained for higher power levels. Curve 503 illustrates the response of for DPD solutions using interpolations as noted above with n=1. Curve 504 illustrates the response of for DPD solutions using interpolations as noted above with n=2. Curve 505 illustrates the response of for DPD solutions using interpolations as noted above with n=3.

For a current example PA under test, nonlinear interpolation function with n=2 produces consistently good results. When the gap between two adjacent power indexes is large, nonlinear interpolation functions outperform linear interpolation for the LUT. When the gap between two adjacent power indexes is smaller than 1 dB, linear interpolation or a DPD solution trained for higher power level index can also work well. We offer the option in our Power-indexed solution to have separate Power-indexed LUT for low power and high power operation region of DPD, with larger LUT size for signals with power larger than a certain power level.

Figure 6:
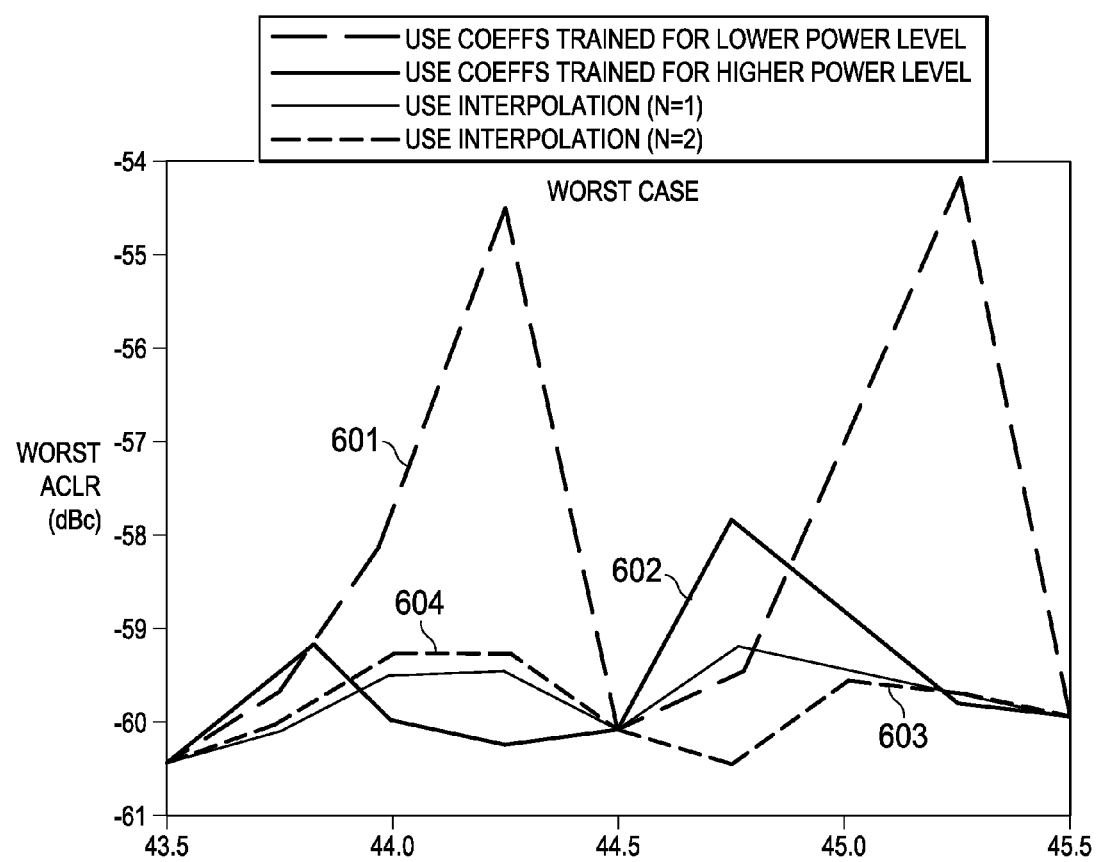
FIG. 6 are plots of worst case ACLR in decibells (dBc) at various power levels (dBm) for different interpolation methods.

FIG. 6 illustrates performance of this invention with various interpolation methods with available DPD solutions for power levels 43.5 dBm, 44.5 dBm and 45.5 dBm and interpolation DPD solutions at power levels 43.75 dBm, 44 dBm, 44.25 dBm, 44.75 dBm, 45 dBm and 45.25 dBm. Curve 601 illustrates the response for DPD solutions trained for lower power levels. Curve 602 illustrates the response for DPD solutions trained for higher power levels. Curve 603 illustrates the response of for DPD solutions using interpolations as noted above with n=1. Curve 604 illustrates the response of for DPD solutions using interpolations as noted above with n=2.

The following are the screen shots of spectrum analyzer during a simple demo test in the Lab. Initially the Power-indexed LUT is empty. The LUT size is set to be 4, and the LUT is being updated when a new DPD solution for a certain power level is available after adaptation. FIG. 4 shows the PA output spectrum for the case when DPD solution for the current signal power level is not available in the LUT, an interpolated DPD solution from our Power-indexed LUT is applied as its solution, and the performance is as great as the DPD solution from adaptation.

This power indexed LUT solution was implemented in software and tested using a Power Amplifier NXP Symmetric 160P, with 2-carrier WCDMA signal, bandwidth 20 M, sampling rate of DPD 245.75 MHz. The performance of different interpolation methods are shown as in the figures below.

For the current PA under test, nonlinear interpolation function with n=2 produces consistently good results. When the gap between two adjacent power indexes is large, nonlinear interpolation functions outperform linear interpolation for the LUT. When the gap between two adjacent power indexes is smaller than 1 dB, linear interpolation or use solution trained for higher power level index can also work well. The option in the power indexed solution of this invention to have separate Power-indexed LUT for low power and high power operation region of DPD, with larger LUT size for signals with power larger than a certain power level.

Figure 7:
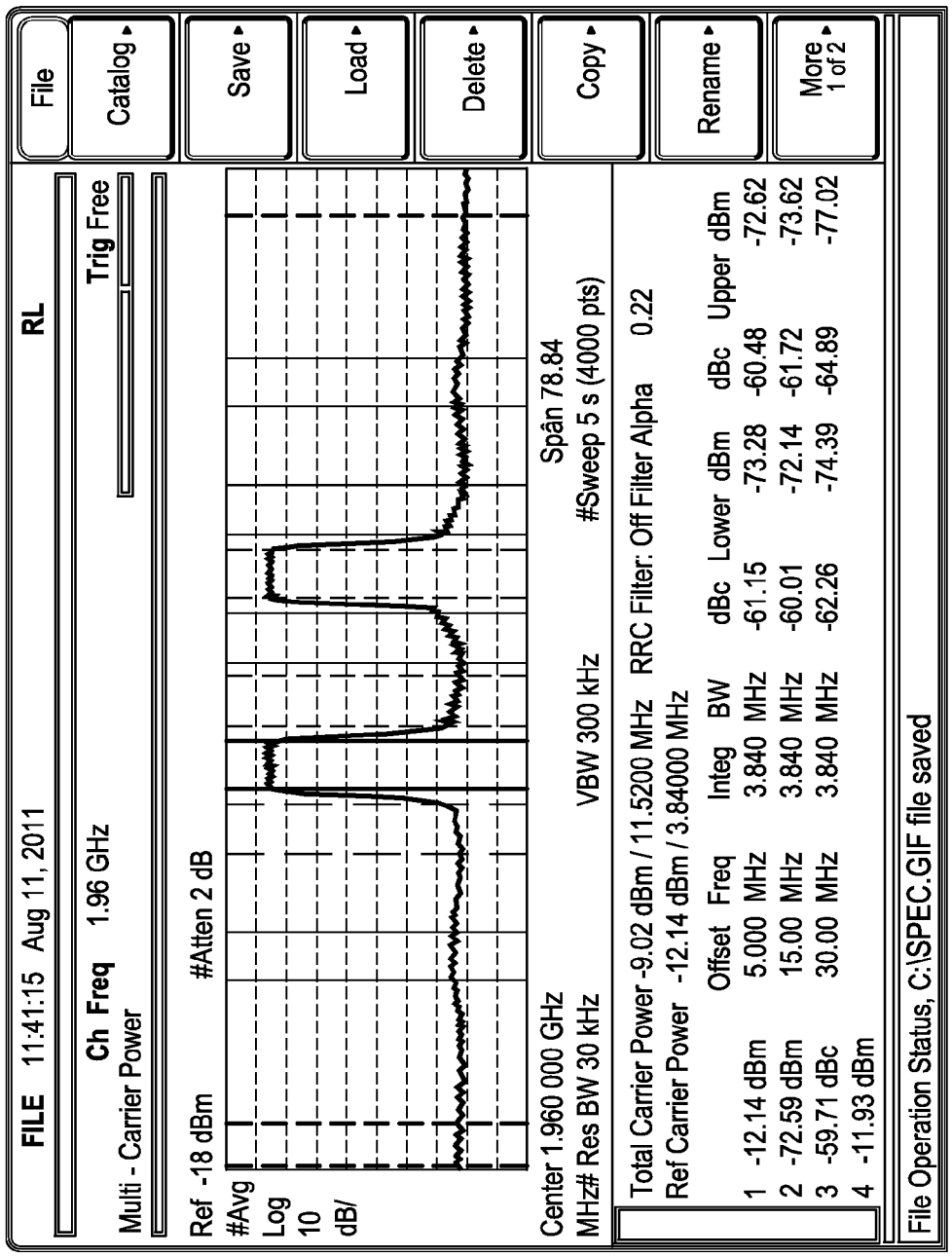
FIG. 7 is the output spectrum of a power amplifier (PA) with interpolated DPD solution from power-indexed look up table of this invention.

FIG. 7 is a screen shot of a spectrum analyzer during a simple demo test. Initially the power-indexed LUT is empty. The LUT size is 4. The LUT is updated when a new DPD solution for a certain power level is available after adaptation. FIG. 7 shows the PA output spectrum for the case when the DPD solution for the current signal power level is not available in the LUT and an interpolated DPD solution is employed. FIG. 7 illustrate the interpolated performance is as good as the DPD solution from adaptation.

What is claimed is:

1. A method of power amplifier digital pre-distortion comprising the steps of:
   measuring a current power level of the power amplifier;
   storing in a look up table a set of entries, each entry consisting of a power level and a corresponding set of digital pre-distortion coefficients;
   selecting an set of digital pre-distortion coefficients by
      if the measured current power level falls within a range associated with a power level index in the look up table, recalling from the look up table the set of digital pre-distortion coefficients corresponding to the power level index,
      if the measured current power level is greater than the maximum power level entry in the look up table, recalling from the look up table the set of digital pre-distortion coefficients corresponding to the maximum power level entry in the look up table,
      if the measured current power level is less than the minimum power level entry in the look up table, recalling from the look up table the set of digital pre-distortion coefficients corresponding to the minimum power level entry in the look up table, and
      if the measured current power level does not fall within a range associated with a power level index in the look up table
         recalling a first set of digital pre-distortion coefficients corresponding to a next power level index below the measured power level, recalling a second set of digital pre-distortion coefficients corresponding to a next power level index above the measured power level, and
         interpolating a third set of digital
   pre-distortion coefficients from the first set of digital pre-distortion coefficients and the second set of digital pre-distortion coefficients;
   generating a digital pre-distortion from the selected set of digital pre-distortion coefficients; and
   applying the digital pre-distortion to the power amplifier.

2. The method of claim 1, wherein:
   said range comprises $P'-\epsilon1$ $P'+\epsilon2$, where: $P'$ is the nearest power table index to the measured power level and $\epsilon1$ and $\epsilon2$ are small empirical constants.

3. The method of claim 1, wherein:
   said step of selecting an set of digital pre-distortion coefficients further includes comparing the measured power level with multiple power levels, each of the multiple power levels corresponding to one index power level of the look up table.

4. The method of claim 1, wherein:
   said step of selecting an set of digital pre-distortion coefficients further includes
      determining a power level change between the measured power level and a prior power level, and
      selecting a next power level in the look up table if the determined power level change is beyond a preset range.

5. The method of claim 1, wherein:
   said step of interpolating a third set of digital pre-distortion coefficients includes $$w_{current} = w_{high} * f(\alpha) + w_{low} * (1 - f(\alpha))$$
   $$f(\alpha) = 1 - (1 - \alpha)^n$$
   $$n = 1, 2, \ldots 5$$
   $$\alpha = \frac{10\log_{10}(P_{current}/P_{low})}{10\log_{10}(P_{high}/P_{low})}$$
   $$P_{current} \in (P_{low}, P_{high})$$

where: $w_{current}$ is a DPD coefficient to be calculated corresponding to DPD coefficients $w_{high}$ of $P_{high}$ and $w_{low}$ of $P_{low}$; $P_{current}$ is the current measured power level; $P_{high}$ is the index power level in the look up table next higher than $P_{current}$; $P_{low}$ is the index power level in the look up table next lower than $P_{current}$; and $P_{current}$, $P_{low}$, $P_{high}$ and $\alpha$ are in the dB domain.

6. The method of claim 1, further comprising:
   measuring distortion of a signal output of the power amplifier;
   calculating a digital pre-distortion coefficients to compensate for the measured distortion; and
   updating data stored in the look up table based upon the calculated digital pre-distortion coefficients and a corresponding measured power level.

7. The method of claim 6, wherein:
   the look up table has fixed power level indices; and
   said step of updating includes replacing the digital pre-distortion coefficients stored at one of the fixed power level indices with the calculate digital pre-distortion coefficients when a measured power level matches the one the fixed power level indices.

8. The method of claim 6, wherein:
   said step of updating includes replacing both power level indices and the corresponding digital pre-distortion coefficients.

9. The method of claim 8, wherein:
   said step of updating includes replacing both power level indices and the corresponding digital pre-distortion coefficients includes
      if the measured current power level is near a power level index in the look up table, replacing the look up table the set of digital pre-distortion coefficients corresponding to the power level index with the calculated digital pre-distortion coefficients,
      if the look up table does not store a maximum number of entries, storing a new entry at an index power level corresponding to the measured power level having the calculated digital pre-distortion coefficients, and
      if the measured current power level is not near a power level index in the look up table and the look up table stores a maximum number of entries
         determining the gaps between the measured power level, the next greater power level index stored in the look up table and the next lower power level index stored in the look up table, and
         replacing a current entry in the look up table which is the lower power level of the smallest determined gap with a new entry having a power level entry corresponding to the measured power level and the calculated digital pre-distortion coefficients.

10. The method of claim 8, further comprising:
    segmenting the look up table into at least two portions, each portion storing only entries having a power level index within a corresponding range of power; and
    wherein said step of updating includes updating only entries of the look up table with the portion of the segmented look up table having a power range including the measured power.

11. The method of claim 10, wherein:
said step of segmenting the look up table permits entries with a higher power density for higher power.

12. The method of claim 8, further comprising:
determining when the distortion over time of the power amplifier is unstable; and
said step of updating includes setting an expiration time of an updated entry in the look up table upon determination the distortion over time is unstable and deleting a look up table entry upon elapse of the corresponding expiration time.

13. A method of power amplifier digital pre-distortion comprising the steps of:
measuring a current power level of the power amplifier;
if the measured current power level falls within a range associated with a power level index in a look up table, recalling from the look up table a set of digital pre-distortion coefficients corresponding to the power level index;
if the measured current power level is greater than a maximum power level entry in the look up table, recalling from the look up table a set of digital pre-distortion coefficients corresponding to the maximum power level entry in the look up table;
if the measured current power level is less than a minimum power level entry in the look up table, recalling from the look up table a set of digital pre-distortion coefficients corresponding to the minimum power level entry in the look up table; and
if the measured current power level does not fall within a range associated with a power level index in the look up table:
recalling a first set of digital pre-distortion coefficients corresponding to a next power level index below the measured power level, recalling a second set of digital pre-distortion coefficients corresponding to a next power level index above the measured power level, and
interpolating a third set of digital pre-distortion coefficients from the first set of digital pre-distortion coefficients and the second set of digital pre-distortion coefficients;
generating a digital pre-distortion from the selected set of digital pre-distortion coefficients; and
applying the digital pre-distortion to the power amplifier.

14. The method of claim 13, said range comprises $P'-\epsilon 1 - P'+\epsilon 2$, where: $P'$ is the nearest power table index to the measured power level and $\epsilon 1$ and $\epsilon 2$ are small empirical constants.

15. The method of claim 13, further including comparing the measured power level with multiple power levels, each of the multiple power levels corresponding to one index power level of the look up table.

16. The method of claim 13, further comprising:
measuring distortion of a signal output of the power amplifier;
calculating digital pre-distortion coefficients to compensate for the measured distortion; and
updating data stored in the look up table based upon the calculated digital pre-distortion coefficients and a corresponding measured power level.

* * * * *